US006407643B2

(12) United States Patent
Canard et al.

(10) Patent No.: US 6,407,643 B2
(45) Date of Patent: Jun. 18, 2002

(54) PHASE-LOCKED LOOP ENABLING THE GENERATION OF A REFERENCE SIGNAL HAVING A HIGH SPECTRAL PURITY

(75) Inventors: David Canard, Caen; Vincent Fillatre, Thaon, both of (FR)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/801,627

(22) Filed: Mar. 8, 2001

(30) Foreign Application Priority Data

Mar. 10, 2000 (FR) ........................................... 00 03134

(51) Int. Cl.[7] .............................. H03L 7/06; H03L 7/18

(52) U.S. Cl. ........................... 331/16; 331/1 A; 331/17; 331/18; 327/156; 327/157; 327/159; 455/260

(58) Field of Search ........................... 331/1 A, 16, 17, 331/18, 25; 327/156–159; 360/51; 375/376; 455/260

(56) References Cited

U.S. PATENT DOCUMENTS 4,242,649 A * 12/1980 Washburn, Jr. .............. 332/18
5,144,260 A * 9/1992 Stribling et al. .............. 331/10

FOREIGN PATENT DOCUMENTS

EP 0821488 1/1998
FR 2474258 7/1981
GB 2150775 A 7/1985

* cited by examiner

*Primary Examiner*—David Mis
(74) *Attorney, Agent, or Firm*—Russell Gross

(57) ABSTRACT

The invention relates to a phase-locked loop, comprising:

Figure 1:
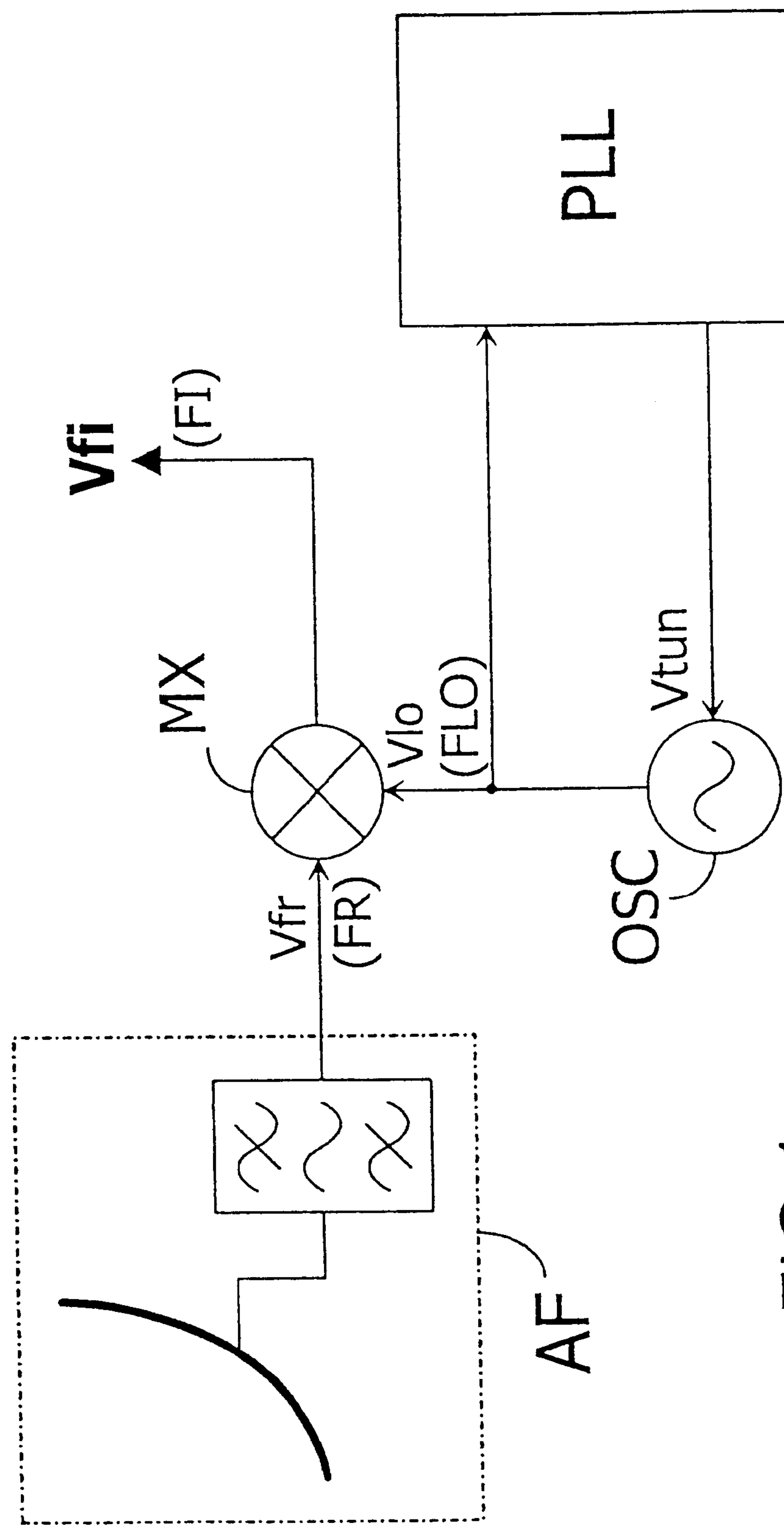

an oscillator OSC intended to produce an output signal Vlo, a frequency divider DIV intended to receive the output signal Vlo from the oscillator OSC, and a phase/frequency detector PD intended to compare the frequency FDIV of the output signal Vdiv of the divider DIV with the frequency of a comparison signal Vcomp, and to supply a tuning signal Vtun to the oscillator, which tuning signal defines the oscillation frequency of the oscillator, A phase-locked loop in accordance with the invention is provided with correction means PMOD intended to detect a parasitic phase modulation applied to the output signal Vlo of the oscillator OSC, and to apply a phase modulation, which is similar to said parasitic phase modulation, to the comparison signal Vcomp.

The invention enables a fractional-N frequency divider to be used and hence the noise generated by the loop to be limited, without affecting the spectral purity of the output signal Vlo of the oscillator OSC. Application: Tuners for receivers of television and radiotelephone signals.

5 Claims, 3 Drawing Sheets

PHASE-LOCKED LOOP ENABLING THE GENERATION OF A REFERENCE SIGNAL HAVING A HIGH SPECTRAL PURITY

The invention relates to a phase-locked loop, comprising:

- an oscillator intended to produce an output signal having an oscillation frequency whose value depends on that of a tuning signal,
- a frequency divider intended to receive the output signal from the oscillator and to supply an output signal having a frequency which is R times lower than the oscillation frequency, and
- a phase/frequency detector intended to compare the frequency of the output signal of the divider with a so-called comparison frequency of a comparison signal, and to supply the tunning signal, whose value is representative of the result of the comparison, to the oscillator.

Such a phase-locked loop is described in European patent application EP 0 821 488 A1. In the majority of known phase-locked loops, the frequency divider receives the output signal from the oscillator and supplies an output signal having a frequency that is N times lower than the oscillation frequency to a phase/frequency comparator, N being an integer whose value is equal to that of a control word. The phase/frequency comparator compares this frequency with a so-called comparison frequency of a comparison signal originating, for example, from a quartz oscillator. If the output frequency of the frequency divider is below the comparison frequency, the phase/frequency comparator commands an increase of the oscillation frequency until the oscillation frequency is equal to N times the comparison frequency. Since the value of the comparison frequency is fixed, the choice of the value of N for the nominal word determines the value of the oscillation frequency. Consequently, the minimum interval between two oscillation frequency values is equal to the value of the comparison frequency. It has been found that the performance in terms of noise of a phase-locked loop is better as the comparison frequency is higher. However, choosing a high comparison frequency means an increase of the minimum interval between two values of the oscillation frequency, which interval is determined by the conditions wherein the phase-locked loop is employed. Thus, in applications where the output signal of the oscillator is used to receive hertzian digital television signals, this minimum interval is predetermined and set at 166.67 kHz by the OFDM standard.

To maintain a constant minimum interval while increasing the value of the comparison frequency, it is thus necessary to use a frequency divider whose division ratio has a non-integer value. Such frequency dividers are commonly referred to as "fractional-N" frequency dividers. Their division ratio is determined by at least two parameters.

For a large number of known fractional-N type dividers, the division ratio R can be expressed as follows: R=N+k/q, where N and k are first and second integer parameters, and q is a third integer parameter whose value is predetermined by the value of the minimum interval between two oscillation frequencies, which is to be kept constant. Thus, q=FCOMP/FSTEP, where FCOMP is the chosen comparison frequency and FSTEP is the minimum interval. Such frequency dividers carry out a division by N during q−k operating cycles of the phase-locked loop, an operating cycle corresponding to one period of the output signal of the frequency divider, and subsequently a division by N+1 during k operating cycles of said loop. Thus, the average division ratio of q cycles of the phase-locked loop is equal to N+k/q.

An balanced operating mode of the phase-locked loop is defined as being a mode wherein the following relation is verified: FDIV=FLO/R=FCOMP, where FDIV is the frequency of the output signal of the frequency divider, and FLO and FCOMP are, respectively, the oscillation and comparison frequencies.

This means that, at the close of q operating cycles of the phase-locked loop, the output signal of the frequency divider and the comparison signal must be in phase and have equal frequencies, i.e. at the close of q operating cycles, in principle, no correction should be made in the value of the oscillation frequency. However, in practice it has been found that at the close of each cycle wherein the division ratio of the frequency divider is equal to N, the output signal of the frequency divider presents a phase shift with respect to the comparison signal, since its frequency FDIV is slightly higher than the comparison frequency FCOMP, FDIV being equal to FLO/N, while FCOMP=FLO/(N+k/q). Although such phase shifts are theoretically compensated for during the cycles wherein the division ratio of the frequency divider is equal to N+1, in practice each phase shift is detected by the phase/frequency detector, which automatically causes a useless and untimely correction of the value of the oscillation frequency. Such corrections generate a parasitic phase modulation of the output signal of the oscillator around its central oscillation frequency, i.e. the instantaneous value of the oscillation frequency varies during the balanced operating mode.

However, the main function of a phase-locked loop is to generate a signal which has an accurately defined oscillation frequency and is intended to be used as a reference, for example by frequency converters included in tuners intended to receive radioelectric signals, inside television receivers or radiotelephones, among other possible applications. A signal affected by a parasitic phase modulation is illesuited for such a purpose.

It is an object of the invention to substantially overcome this drawback by providing a phase-locked loop having a good noise performance by virtue of the use of a fractional-N frequency divider, without said divider introducing a parasitic phase modulation into the output signal of the oscillator whose oscillation frequency is regulated by the loop.

Indeed, in accordance with the invention, a phase-locked loop in accordance with the opening paragraph is provided with correction means intended to detect a parasitic phase modulation applied to the output signal of the oscillator, and to apply a phase modulation, which is similar to said parasitic phase modulation, to the comparison signal.

In the phase-locked loop in accordance with the invention, the input signals of the phase/frequency detector are made synchronous during the balanced operating mode. Consequently, the phase/frequency detector does not cause untimely corrections, thereby causing the parasitic phase modulation of the output signal of the oscillator to disappear. It is to be noted, in addition, that the invention enables the parasitic modulation to be automatically eliminated inside the phase-locked loop without any outside intervention.

In a particular embodiment of the invention, the correction means include:

- storage means for storing the value adopted by the tuning signal at the close of q cycles of the phase-locked loop, and
- phase-shifting means for applying a phase shift to the comparison signal at each $i^{th}$ (i=1 to q) cycle of the phase-locked loop, the value of said phase shift being determined by the product of the value stored by the storage means and a coefficient L(i) that is specific to the cycle in question.

In this embodiment, a non-zero value of the tuning signal at the close of q operating cycles of said loop signals the existence of a parasitic phase modulation of the output signal of the oscillator. The value of this tuning signal determines the magnitude of the phase shifts to be imposed on the comparison signal so as to cause this comparison signal to be affected by a phase modulation which is identical to the parasitic phase modulation. In the course of time, the magnitude of the parasitic modulation decreases, due to the correction thus effected, which implies a gradual reduction of the value stored by the storage means and hence an automatic reduction of the magnitude of the corrections made in the phase of the comparison signal, said automatic reduction being attributable to the particular nature of the phase-shift means described hereinabove. When the value becomes zero, no correction is applied to the comparison signal anymore.

The phase-shift means described hereinabove enable the comparison signal to be subjected, in the course of each operating cycle of the phase-locked loop, to a phase shift such that the comparison signal thus obtained and the output signal of the frequency divider are in phase at the close of this cycle, irrespective of the value of the division ratio in the course of this cycle. Indeed, the value of the coefficient L(i) is determined for each cycle, taking into account the division ratio used in the course of said cycle. The values of the coefficients L(i) are advantageously chosen by means of the following relations:

$$L(i)=L(i-1)+k, \text{ if } L(i-1)<q,$$

and $$L(i)=L(i-1)-q, \text{ if } L(i-1)>q.$$

Many embodiments of the phase-shift means can be envisaged and are within the reach of those skilled in the art. A particularly advantageous embodiment takes advantage of the fact that the comparison signal, originating most usually from a quartz oscillator having well-defined characteristics, shows a linear course proximate to the zero value, the zero-crossings of the comparison signal being occurrences with respect to which edges of the output signal of the frequency divider are compared.

A voltage shift of the comparison signal then causes a time shift of said zero-crossings, the value of said shift being proportional to that of the voltage shift. In this embodiment of the invention, the phase-shift means will thus be advantageously designed to apply a voltage shift to the comparison signal in the course of each $i^{th}$ (i=i to q) cycle of the loop, the size of said voltage shift being proportional to L(i) times the value stored by the storage means.

As described hereinabove, phase-locked loops using a fractional-N frequency divider are advantageously employed to generate reference signals enabling frequency conversions, while yielding a good noise performance, in certain applications where the minimum interval separating two oscillation frequencies has a set value. In an application of such phase-locked loops, the invention thus relates to a device intended to receive radioelectric signals, for example a television receiver or a radiotelephone, including:

- an input stage intended to receive a radioelectric signal and to convert this signal to an electronic output signal having a so-called radio frequency,
- a phase-locked loop as claimed in claim 1, intended to adjust the oscillation frequency of the output signal of an oscillator, and
- a mixer intended to receive the output signals from the input stage and the oscillator, and to supply a signal whose frequency is equal to the difference between the radio frequency and the oscillation frequency.

These and other aspects of the invention will be apparent from and elucidated with reference to the non-limitative embodiments(s) described hereinafter.

Figure 2:
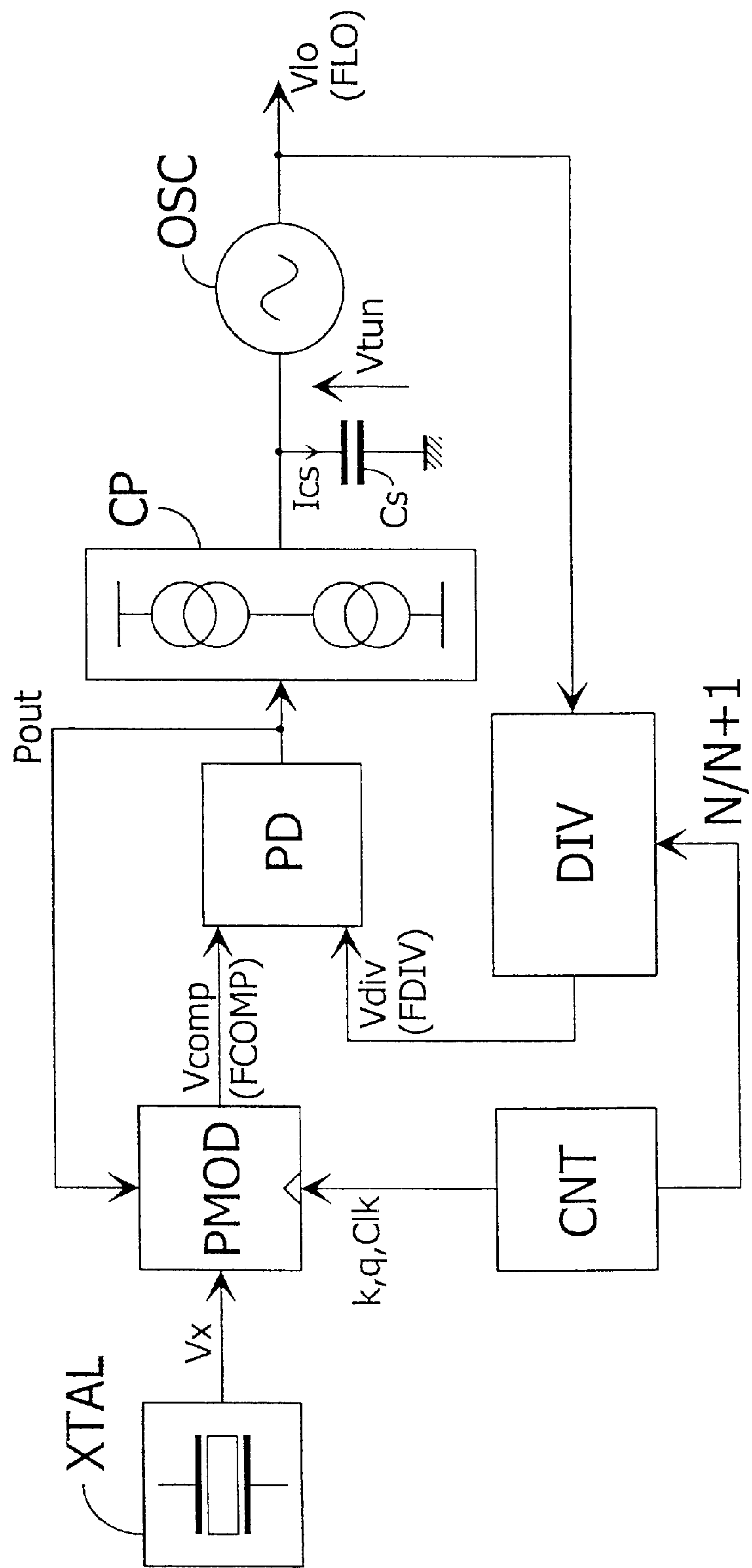
Figure 3:
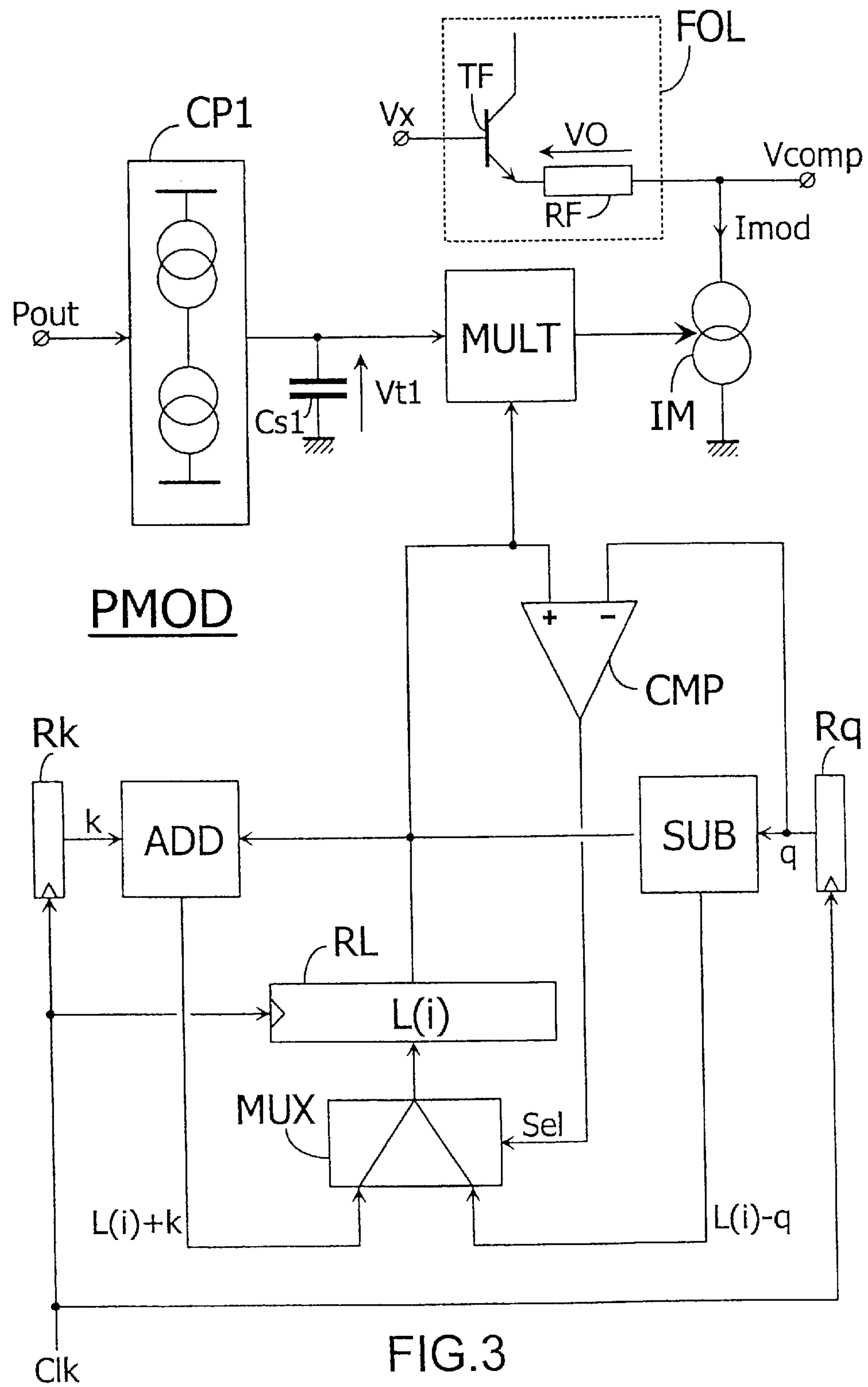

In the drawings:

FIG. 1 is a partial functional diagram illustrating a receiver of radioelectric signals providing implementation of the invention, FIG. 2 is a functional diagram illustrating a phase-locked loop in accordance with the invention, and FIG. 3 is a functional diagram illustrating correction means included in a phase-locked loop in accordance with a preferred embodiment of the invention.

FIG. 1 diagrammatically shows a device for receiving radioelectric signals, such as a receiver of television signals, comprising an input stage AF, for example an antenna and filtering system enabling the reception of a signal whose frequency is selected from a range of given frequencies, and the transformation to an electronic signal Vfr, commonly referred as radio signal, having a frequency FR, commonly referred to as radio frequency, in which device a frequency conversion, from the selected frequency FR towards a predetermined intermediate frequency FI, is carried out by means of a mixer MX intended to receive the radio signal Vfr, on the one hand, and the output signal Vlo of a local oscillator OSC.

The intermediate frequency FI is fixed and equal to the difference between the radio frequency FR and the oscillation frequency FLO of the output signal Vlo of the first local oscillator OSC. The choice of said oscillation frequency FLO thus determines the value of the selected radio frequency FR.

In this device, the oscillation frequency FLO of the output signal Vlo of the first local oscillator OSC is determined by a tuning signal Vtun supplied by a regulating module PLL forming, in combination with the local oscillator OSC, a phase-locked loop.

FIG. 2 shows a more detailed representation of this phase-locked loop, which comprises:

- the local oscillator OSC intended to supply the output signal Vlo whose frequency FLO is determined by the value of a tuning signal Vtun,
- a frequency divider DIV intended to receive the output signal Vlo from the local oscillator OSC, and to supply an output signal Vdiv having a frequency FDIV, a control word N/N+1 supplied by a control module CNT determining, for each cycle of the loop, the instantaneous value of the ratio of the frequency division effected by the divider DIV,
- a phase/frequency detector PD intended to compare the frequency FDIV of the output signal Vdiv of the frequency divider DIV with a comparison frequency FCOMP of a comparison signal Vcomp originating, in this example, from a quartz oscillator XTAL, and to supply a driving signal Pout that is representative of the result of said comparison, and
- a charge pump CP the conduction of which is intended to be controlled by the driving signal Pout, an output of the charge pump CP being connected to a capacitor Cs intended to generate the tuning signal Vtun at its terminals, which tuning signal is thus formed, in this case, by a voltage.

If the oscillation frequency FLO of the first local oscillator OSC is lower than R times the frequency FCOMP of the comparison signal Vcomp, the driving signal Pout is positive, resulting in the charge pump CP being ordered to supply a positive current Ics. This current, which is transmitted to the capacitor Cs, causes an increase of the tuning voltage Vtun taken from the terminals of the capacitor Cs, and hence an increase of the oscillation frequency FLO. When the oscillation frequency FLO becomes higher than the frequency of the comparison signal Vcomp, the control signal Pout becomes negative, resulting in an inversion of the direction of the current Ics, which becomes negative. This negative current, which is transmitted to the capacitor Cs, causes a reduction of the regulating voltage Vtun taken from the terminals of the capacitor Cs, and hence a reduction of the oscillation frequency FLO. The phase-locked loop tends towards a balanced operating mode, wherein $$FLO=R.FDIV=R.FCOMP.$$

The frequency divider DIV is, in this case, a "fractional-N" type divider, whose division ratio R between the frequency FLO of its input signal Vlo and the frequency FDIV of its output signal Vdiv is customarily expressed as follows: R=FLO/FDIV=N+k/q, where N, k and q are integer parameters. In fact, such frequency dividers carry out a division by N during q−k operating cycles of the phase-locked loop, one operating cycle corresponding to one period of the output signal Vdiv of the frequency divider DIV, and next a division by N+1 during k operating cycles of said loop. Thus, the average value of the division ratio of q cycles of the phase-locked loop is equal to N+k/q. The value of the parameter q is predetermined by the value of the minimum interval between two oscillation frequencies, which must be kept constant. Thus, q=FCOMP/FSTEP, where FCOMP is the selected comparison frequency and FSTEP is the minimum interval. In the example of the hertzian digital television signals mentioned hereinabove, FSTEP=166.67 kHz, which implies that q is 24 if FCOMP is chosen to be 4 MHz.

A balanced operating mode of the phase-locked loop is defined as a mode wherein the following relation is verified: FDIV=R.FLO=FCOMP. This means that at the close of q operating cycles of the phase-locked loop, the output signal Vdiv of the frequency divider DIV and the comparison signal Vcomp must be in phase and have equal frequencies, i.e. at the close of q operating cycles, in principle, no correction must be made in the value of the oscillation frequency FLO. In fact, it is observed in the known phase-locked loops that at the close of each cycle wherein the division ratio R of the frequency divider DIV is equal to N, the output signal Vdiv of the frequency divider DIV exhibits a phase shift with respect to the comparison signal Vcomp, which can be attributed to the fact that its frequency FDIV is slightly higher than the comparison frequency FCOMP, FDIV being equal to FLO/N whereas FCOMP=FLO/(N+k/q). Although such phase shifts are theoretically compensated for during the cycles wherein the division ratio R of the frequency divider DIV is equal to N+1, in practice each phase shift is detected by the phase/frequency detector PD, which automatically causes a useless and untimely correction of the value of the oscillation frequency FLO. Such corrections generate a parasitic phase modulation of the output signal Vlo of the oscillator OSC around its central oscillation frequency FLO, i.e. the instantaneous value of the oscillation frequency FLO varies in the course of the balanced operating mode. However, the phase-locked loop is intended to generate a signal Vlo whose oscillation frequency FLO serves as a reference for the selection of a radio frequency FR, as explained hereinabove. The phase-locked loop in accordance with the invention thus comprises correction means PMOD intended to detect a parasitic phase modulation applied to the output signal Vlo of the oscillator, and to apply a phase modulation similar to said parasitic phase modulation to the comparison signal Vcomp.

FIG. 3 describes a preferred embodiment of correction means PMOD. These means comprise:

storage means (CP1, Cs1) for storing the value Vt1 adopted by the tuning signal at the close of q cycles of the phase-locked loop, and phase-shift means (RL, Rk, Rq, MULT, FOL) for applying a phase shift to the comparison signal Vcomp at each $i^{th}$ (i=1 to q) cycle of the phase-locked loop, the value of said phase shift being determined by the product of the value Vt1 stored by the storage means (CB1, Cs1) and a coefficient L(i) that is specific to the cycle in question.

In this case, the storage means are formed by a charge pump CP1, which is identical to the above-described charge pump CP, and which is intended to charge or discharge a capacitor Cs1, which is identical to the above-described capacitor Cs, according to the value of the driving signal Pout generated by the phase/frequency detector PD.

Consequently, the voltage Vt1 thus generated at the terminals of the capacitor Cs1 is theoretically identical to the regulating signal Vtun.

The phase-shift means comprise three registers RL, Rk and Rq, intended to be reloaded when a clock signal Clk, provided by the control module CNT shown in FIG. 2, exhibits an active edge, for example a rising edge. The registers Rk and Rq receive the values of the parameters k and q from the control module. The register RL contains the value of the coefficient L(i) of the cycle in progress.

The phase-shift means additionally comprise a digital adder ADD intended to receive the value of the coefficient L(i) at an input, and the value of the parameter k at another input. The phase-shift means further comprise a digital subtracter SUB intended to receive the value of the coefficient L(i) at one input, and the value of the parameter q at another input. The phase-shift means also comprise a digital multiplexer MUX two data inputs of which are connected to the outputs of the adder ADD and of the subtracter SUB, a data output of said digital multiplexer being connected to the register RL. In the course of each $i^{th}$ operating cycle (i=1 to q) of the phase-locked loop, a digital comparator CMP compares the value of the parameter q to that of the coefficient L(i) corresponding to this cycle, and supplies a selection signal Sel, which is representative of the result of the comparison, to the multiplexer MUX. If L(i)<q, the selection signal Sel is in the inactive state, for example at the logic level 0, and the output of the adder ADD is connected to the register RL via the multiplexer MUX. Conversely, if L(i)>q, the selection signal Sel is in the active state, for example at the logic level 1, and the subtracter SUB is connected to the register RL via the multiplexer MUX. At the beginning of the next cycle i+1, the control module imposes an active edge on the clock signal Clk, and the register RL stores a new coefficient L(i+1) which is adapted to this cycle, the value of which is the value of the signal present at the output of the multiplexer MUX. The value of each coefficient L(i) (i=1 to q) is determined by the relations:

$$L(i)=L(i-1)+k, \text{ if } L(i-1)<q,$$

and $$L(i)=L(i-1)-q, \text{ if } L(i-1)>q.$$

A multiplier MULP carries out a multiplication of the value Vt1 stored by the storage means (CP1, Cs1) and the value of the coefficient L(i) for the cycle in progress. The result of this multiplication determines the value of a current Imod produced by a variable current source IM, which is designed so that Imod=M.L(i).Vt1, where M is a constant intrinsic to the connection between the multiplier MULT and the current source IM. The comparison signal Vcomp originates from a quartz oscillator via a follower stage FOL, comprising a transistor TF, intended to receive, at its base, the output signal Vx of the quartz oscillator, and a resistor RF, connected to the current source IM. The resistor RF then produces a voltage shift VO=RF.Imod=RF.M.L(i).Vt1, the size of which thus is proportional to L(i) times the value Vt1 stored by the storage means (CP1, Cs1).

Since the output signal Vx of the quartz oscillator is linear in shape proximate to the zero value, a voltage shift of the comparison signal Vcomp causes a time shift of the zero-crossings of this signal, which zero-crossings constitute the occurrences with respect to which edges of the output signal of the frequency divider are compared. As the value of the coefficient L(i) is determined by each cycle, taking into account the division ratio used in the course of the cycle, the phase shift thus imposed on the comparison signal Vcomp is such that the signal will be systematically in phase with the output signal of the frequency divider at the close of each cycle, irrespective of the value of the division ratio in the course of the cycle.

Other embodiments of the correction means can be envisaged, which may relate to elements situated outside the phase-locked loop, but the example described hereinabove has the advantage of carrying out a correction within the phase-locked loop in a manner that is transparent to the user.

What is claimed is:

1. A phase-locked loop, comprising:

an oscillator intended to produce an output signal having an oscillation frequency whose value depends on that of a tuning signal, a frequency divider intended to receive the output signal from the oscillator and to supply an output signal having a frequency which is R times lower than the oscillation frequency, and a phase/frequency detector intended to compare the frequency of the output signal of the divider with a so-called comparison frequency of a comparison signal, and to supply the tuning signal, whose value is representative of the result of the comparison, to the oscillator, which phase-locked loop is characterized in that it is provided with correction means intended to detect a parasitic phase modulation applied to the output signal of the oscillator, and to apply a phase modulation, which is similar to said parasitic phase modulation, to the comparison signal.

2. A phase-locked loop as claimed in claim 1, wherein the division ratio of the frequency divider can be expressed as follows: R=N+k/q, where N, k and q are integer parameters, characterized in that the correction means include:

storage means for storing the value adopted by the tuning signal at the close of q cycles of the phase-locked loop, and phase-shifting means for applying a phase shift to the comparison signal at each $i^{th}$ (i=1 to q) cycle of the phase-locked loop, the value of said phase shift being determined by the product of the value stored by the storage means and a coefficient L(i) that is specific to the cycle in question.

3. A phase-locked loop as claimed in claim 2, characterized in that the value of each coefficient L(i) (i=1 to q) is determined by the following relations:

$$L(i)=L(i-1)+k, \text{ if } L(i-1)<q,$$

and $$L(i)=L(i-1)-q, \text{ if } L(i-1)>q.$$

4. A phase-locked loop as claimed in claim 2, characterized in that the phase-shift means are designed so as to apply a voltage shift to the comparison signal in the course of each $i^{th}$ (i=i to q) cycle of the loop, the size of said voltage shift being proportional to L(i) times the value stored by the storage means.

5. A device intended to receive radioelectric signals, including:

an input stage intended to receive a radioelectric signal and to convert this signal to an electronic output signal having a so-called radio frequency, a phase-locked loop as claimed in claim 1, intended to adjust the oscillation frequency of the output signal of an oscillator, and a mixer intended to receive the output signals from the input stage and the oscillator, and to supply a signal whose frequency is equal to the difference between the radio frequency and the oscillation frequency.

* * * * *